(12) United States Patent
Heragu et al.

(10) Patent No.: US 7,573,307 B2
(45) Date of Patent: Aug. 11, 2009

(54) SYSTEMS AND METHODS FOR REDUCED AREA DELAY LOCKED LOOP

(75) Inventors: Keerthinarayan P. Heragu, Richardson, TX (US); Padattil K. Nisha, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 84 days.

(21) Appl. No.: 11/832,045

(22) Filed: Aug. 1, 2007

(65) Prior Publication Data
US 2009/0033388 A1    Feb. 5, 2009

(51) Int. Cl.
H03L 7/06    (2006.01)
(52) U.S. Cl. ..................................... 327/156
(58) Field of Classification Search ................ 327/158; 365/233.1, 233.11
See application file for complete search history.

(56) References Cited

U.S. PATENT DOCUMENTS

| | | | | |
|---|---|---|---|---|
| 5,970,110 | A * | 10/1999 | Li ................................ | 377/48 |
| 6,005,421 | A * | 12/1999 | Saeki .......................... | 327/119 |
| 6,239,632 | B1 * | 5/2001 | Moyal et al. ................. | 327/153 |
| 6,775,342 | B1 * | 8/2004 | Young et al. ................. | 375/371 |
| 6,940,768 | B2 | 9/2005 | Dahlberg et al. | |
| 6,943,602 | B1 * | 9/2005 | Lee ............................. | 327/158 |
| 6,946,872 | B1 | 9/2005 | Pan et al. | |
| 7,010,014 | B1 * | 3/2006 | Percey et al. ................ | 375/130 |
| 7,126,399 | B1 | 10/2006 | Lee | |
| 7,161,397 | B2 * | 1/2007 | Lee et al. ..................... | 327/149 |
| 7,200,062 | B2 * | 4/2007 | Kinsely et al. .............. | 365/222 |
| 7,234,069 | B1 | 6/2007 | Johnson | |
| 7,319,345 | B2 * | 1/2008 | Farjad-rad et al. ............ | 327/99 |
| 7,349,277 | B2 * | 3/2008 | Kinsley et al. .............. | 365/222 |
| 7,385,428 | B2 * | 6/2008 | Lee et al. ..................... | 327/149 |
| 7,388,795 | B1 * | 6/2008 | To et al. ...................... | 365/194 |
| 7,436,265 | B2 * | 10/2008 | Park et al. ..................... | 331/18 |
| 2003/0103407 | A1 * | 6/2003 | Ooishi et al. ................. | 365/233 |
| 2007/0103212 | A1 * | 5/2007 | Lee et al. ..................... | 327/149 |

(Continued)

OTHER PUBLICATIONS

U.S. Appl. No. 11/832,021, filed Aug. 1, 2007, Heragu.

(Continued)

Primary Examiner—Donovan Lincoln
Assistant Examiner—Adam D Houston
(74) Attorney, Agent, or Firm—Alan K. Stewart; W. James Brady; Frederick J. Telecky, Jr.

(57) ABSTRACT

Various systems and methods for signal synchronization are disclosed. For example, some embodiments of the present invention provide methods for reduced area delay signal timing. Such methods include providing a delay lock loop circuit with a plurality of selectable delay elements. The methods further include operating the delay lock loop circuit in a first mode where a program number is established in relation to a reference frequency. The program number corresponds to a number of the plurality of selectable delay elements used to establish a first delay time at the reference frequency. The program number is multiplied by a multiplicand, and the product of the multiplication is used while operating the delay lock loop circuit in a second mode to select the number of delay elements utilized in delaying an input signal. In the second mode, an input signal is delayed by a second delay time that is approximately the first delay time multiplied by the multiplicand.

10 Claims, 7 Drawing Sheets

U.S. PATENT DOCUMENTS

2007/0262799 A1* 11/2007 Nagata ................. 327/158
2007/0268777 A1* 11/2007 Brox .................... 365/233
2008/0180148 A1* 7/2008 Lundberg ............. 327/158
2008/0181046 A1* 7/2008 Vergnes et al. ...... 365/233.1
2008/0284477 A1* 11/2008 Heidel et al. ......... 327/160

OTHER PUBLICATIONS

U.S. Appl. No. 11/832,030, filed Aug. 1, 2007, Nisha.
U.S. Appl. No. 11/832,036, filed Aug. 1, 2007, Heragu.

* cited by examiner

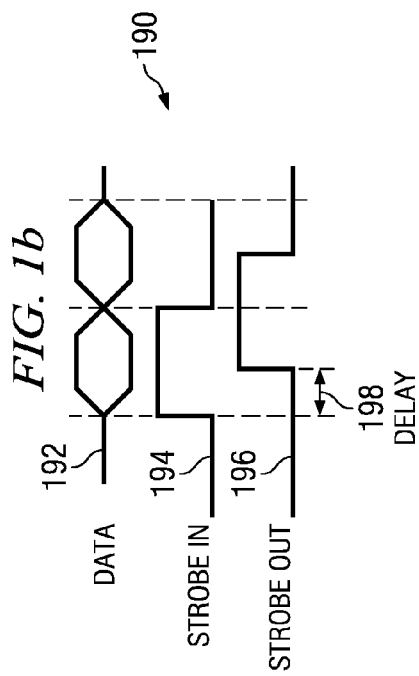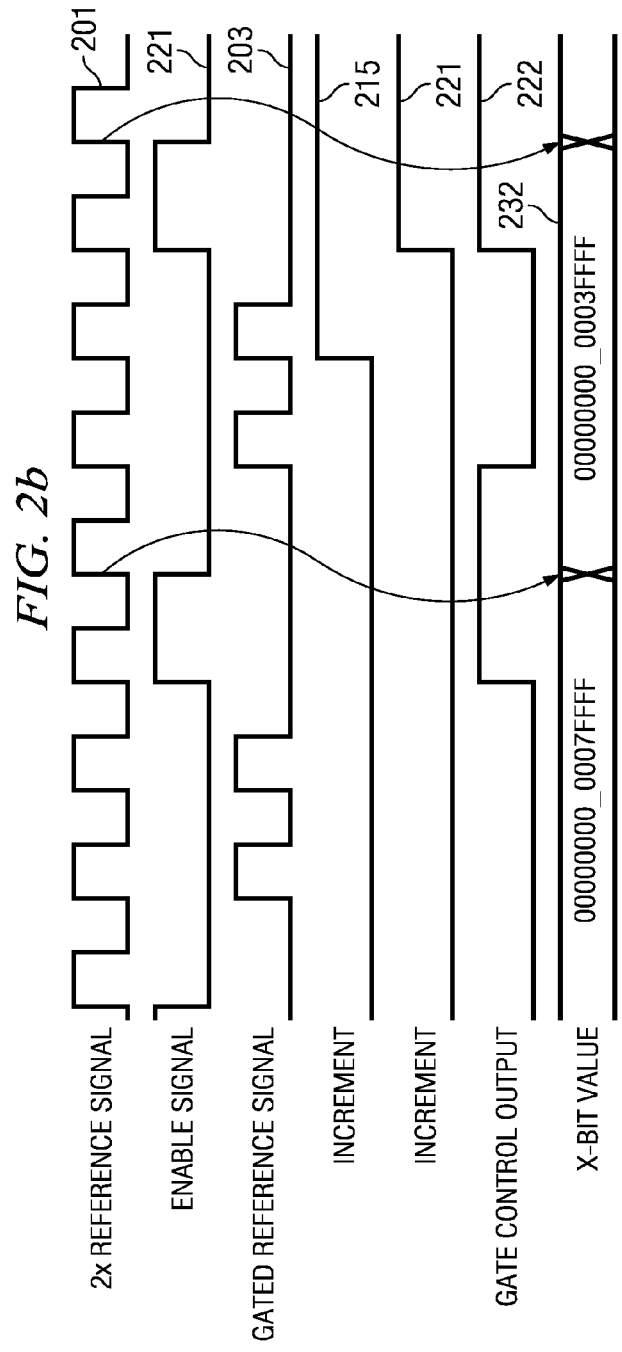

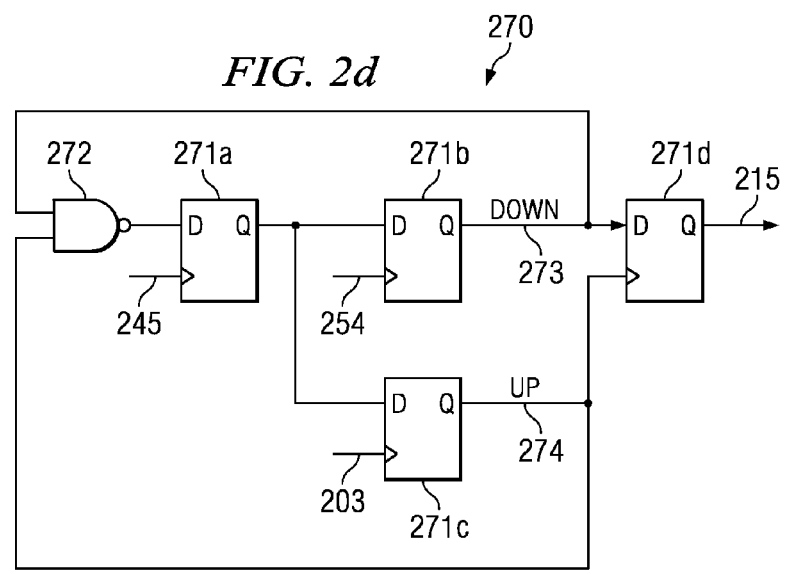
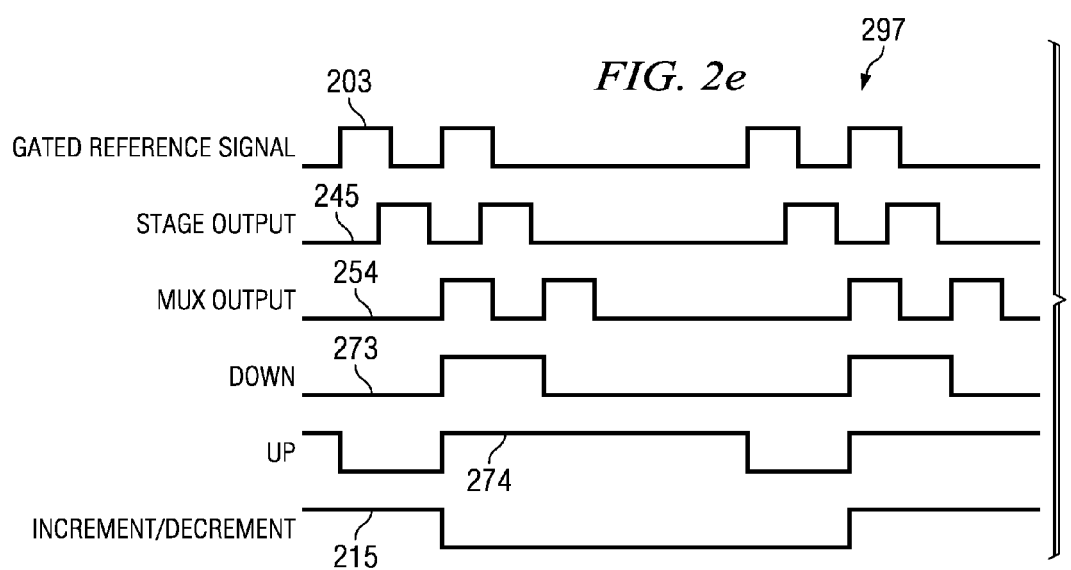

SYSTEMS AND METHODS FOR REDUCED AREA DELAY LOCKED LOOP

BACKGROUND OF THE INVENTION

The present invention is related to event synchronization, and more particularly to systems and methods for synchronizing one signal to another signal in a semiconductor device.

Synchronizing one electrical signal to another often involves applying the signal to a data input of a flip-flop, and clocking the flip-flop using a clock to which the signal is to be synchronized. The signal to be synchronized generally must be applied to the data input of the flip-flop for a defined period before the clock transitions (i.e., setup time), and must remain for a defined period after the clock transitions (i.e., hold time). By assuring that the setup and hold times are met, predictable circuit operation is achieved.

In some cases, a delay lock loop circuit has been used to delay a signal in relation to a synchronizing clock to assure that setup and hold times are met. Such delay lock loops may be iteratively updated until a desired delay is achieved. Implementation of such a delay lock loop typically requires substantial circuitry and a corresponding amount of chip area. This leads to increased chip costs and in some cases reduced yield.

Thus, for at least the aforementioned reasons, there exists a need in the art for advanced systems and devices for implementing a signal delay.

BRIEF SUMMARY OF THE INVENTION

The present invention is related to event synchronization, and more particularly to systems and methods for synchronizing one signal to another signal in a semiconductor device.

Various embodiments of the present invention provide methods for reduced area delay signal timing. Such methods include providing a delay lock loop circuit with a plurality of selectable delay elements. The methods further include operating the delay lock loop circuit in a first mode where a program number is established in relation to a reference frequency. The program number corresponds to a number of the plurality of selectable delay elements used to establish a first delay time at the reference frequency. The program number is multiplied by a multiplicand, and the product of the multiplication is used while operating the delay lock loop circuit in a second mode to select the number of delay elements utilized in delaying an input signal. In the second mode, an input signal is delayed by a second delay time that is approximately the first delay time multiplied by the multiplicand. In some instances of the aforementioned embodiments, the multiplicand is a power of two, and the multiplication process is accomplished by shifting the program number to the right or to the left. In one particular instance of the aforementioned embodiments, the multiplicand is the integer 2, and multiplying the program number by the multiplicand includes shifting the program number to the left by one bit. In another particular instance of the aforementioned embodiments, shifting the program number is accomplished by aligning the program number with delay elements such that an effective shift is incurred. In yet another particular instance of the aforementioned embodiments, multiplication includes applying the multiplicand and the program number to a multiplier circuit. As yet a further instance of the aforementioned embodiments, multiplication includes replicating delay element enable signals.

In various instances of the aforementioned embodiments, the first mode is a master mode and the second mode is a slave mode. In some instances of the aforementioned embodiments, the delay lock loop circuit may be implemented in relation to a DDR memory. In such instances, the reference frequency may be obtained by using a 2× clock implemented as part of the DDR memory interface. In some instances of the aforementioned embodiments, the delay lock loop circuit is operable to provide a particular delay using a reduced area when compared with a non-multiplying delay lock loop circuit.

In one or more instance of the aforementioned embodiments, the plurality of selectable delay elements is a first plurality of selectable delay elements incorporated in a first delay stage. In such instances, the delay lock loop circuit may further include a second plurality of selectable delay elements incorporated in a second delay stage. In master mode, a reference clock operating at the reference frequency is applied to the first delay stage and an output of the first delay stage is applied to the second delay stage. In some such cases, the output signal is a first output signal, and operating the delay lock loop circuit in the second mode may include applying the first input signal to the first delay stage programmed with the program number multiplied by the multiplicand such that the first delay stage provides a first delay output. The methods may further include applying a second input signal to the second delay stage programmed with the program number multiplied by the multiplicand, wherein the second delay stage provides a second delay output.

Other embodiments of the present invention provide delay lock loop circuits that include at least a first delay stage and a second delay stage. In addition, the delay lock loop circuits include a register, a feedback loop, and a multiplication circuit. The first delay stage includes a first plurality of selectable delay elements, and is operable to receive an input clock and to provide a stage clock that is a delayed derivative of the input clock. The second delay stage includes a second plurality of selectable delay elements, and is operable to receive an input signal. The register maintains a program number that determines a number of the plurality of selectable delay elements used in the delay stage. The feedback loop that is operable to establish the program number corresponding to a desired delay time, and the multiplication circuit multiplies the program number by a multiplicand. A selected number of the second plurality of selectable delay elements are used to delay the input signal to derive an output signal, and wherein the output signal is delayed the desired delay time multiplied by the multiplicand.

Yet other embodiments of the present invention provide methods for signal synchronization. Such methods include providing at least a first delay stage and a second delay stage. The first delay stage includes a first selectable plurality of delay elements, and the second delay stage includes a second plurality of delay elements. The methods further include applying a reference clock to the first delay stage such that an output of the first delay stage is a first derivative of the reference clock, and applying the first derivative of the reference clock to the second delay stage such that an output of the second delay stage is a second derivative of the reference clock. The second derivative of the reference clock is a phase shift delayed from the reference clock. The methods further include, repeatedly selecting a number of the first plurality of delay stages and the second plurality of delay stages until the phase shift is at a desirable amount; multiplying the number of the first plurality of delay elements and the second plurality of delay elements by a multiplicand; and applying the product of the multiplication to a slave stage such that the product of the multiplication determines a number of utilized delay elements in the slave stage. In some instances of the aforementioned embodiments, the delay lock loop circuit operates in a master mode and a slave mode. In such cases, a portion of circuitry may be reused in both the first delay stage and the slave stage depending upon whether the delay lock loop circuit is operating in the master mode or the slave mode. In one or more instances of the aforementioned embodiments, the delay lock loop circuit is implemented in relation to a DDR memory interface that includes a 2× clock and a 1× clock. In such cases, the DDR memory interface includes a 1× clock and a 2× clock. The reference clock is the 2× clock, and the 1× clock is applied to the slave stage.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIG. 1b depicts a strobe signal delayed in relation to a data signal;

FIGS. 2a-2e show a delay lock loop circuit locking to a 2× reference signal in accordance with some embodiments of the present invention;

DETAILED DESCRIPTION OF THE INVENTION

Figure 1A:
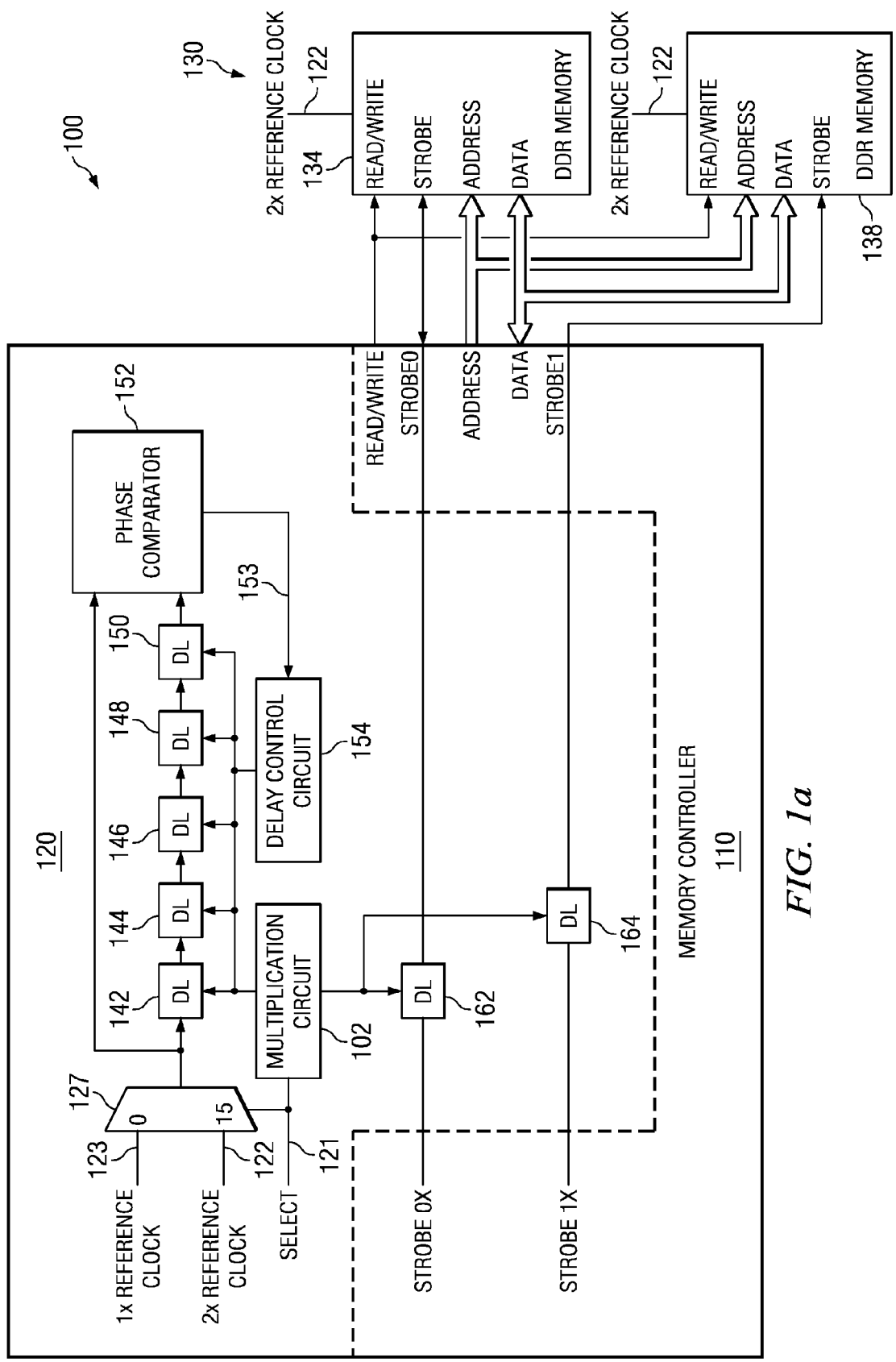
FIG. 1a shows a memory system that utilizes a combination memory controller and delay lock loop circuit in accordance with one or more embodiments of the present invention.

The present invention is related to event synchronization, and more particularly to systems and methods for synchronizing one signal to another signal in a semiconductor device.

The number of delay elements in a delay lock loop circuit depends upon the minimum frequency to which the delay lock loop circuit is expected to be able to synchronize to. The time delay introduced by a given delay element defines the resolution of a delay lock loop circuit. It is desirable to have a relatively small time delay. To assure both a wide spectrum of operation for a delay lock loop circuit and a small resolution, a large number of delay elements are often required by a delay lock loop circuit. This leads to a very large circuit area and a relatively large power consumption.

Various embodiments of the present invention provide systems, circuits and methods for reduced area implementation of a delay lock loop circuit. As an example, some embodiments of the present invention provide methods for synchronizing a master portion of a delay lock loop circuit to a reference signal operating at some multiple of a frequency corresponding to the operation of a slave portion of the delay lock loop circuit. For example, the master portion may perform a phase synchronization to a reference signal that operates at a frequency that is M times the frequency corresponding to the operation of a slave portion of the delay lock loop circuit. By doing so, the area of the delay locked loop circuit may be substantially reduced as the number of delay elements implemented in the delay stages of the master portion may be only 1/M of the number implemented in delay stages of the slave portion to achieve predicted delays. This results in a reduction in circuit area required to implement a delay lock loop circuit.

In some cases of the aforementioned embodiments, the methods are employed in relation to a double data rate memory where a 2× reference clock is available at the interface of the memory. In such cases, the master portion of the delay lock loop circuit is operated using the 2× reference clock. Thus, no additional clock generation is required to achieve the savings in area discussed above.

The aforementioned methods include providing a delay lock loop circuit with a plurality of selectable delay elements. The methods further include operating the delay lock loop circuit in a master mode where a program number is established in relation to a reference frequency. This may include, for example, operating a master portion of the delay lock loop circuit. The program number corresponds to a number of the plurality of selectable delay elements used to establish a first delay time at the reference frequency. The program number is multiplied by a multiplicand, and the product of the multiplication is used while operating the delay lock loop circuit in a slave mode to select the number of delay elements utilized in delaying an input signal. Operation in the slave mode may include, for example, operating a slave portion of the delay lock loop circuit. In some cases of the aforementioned embodiments, the slave portion and the master portion are mutually exclusive and may be operated simultaneously. In other cases of the aforementioned embodiments, the master portion and the slave portion share circuitry and therefore are not operated simultaneously. In the slave mode, an input signal is delayed by a second delay time that is approximately the first delay time multiplied by the multiplicand. In some instances of the aforementioned embodiments, the multiplicand is a power of two.

The aforementioned multiplication process may be accomplished using any multiplication process known in the art. For example, the multiplication process may be accomplished using a known multiplier circuit where the program number is provided and multiplied by a provided multiplicand. Other less hardware intensive approaches may also be used. For example, the multiplication process may be accomplished by shifting the program number right or left where the multiplicand is a power of two (e.g., ... ¼, ½, 2, 4 ...). As yet another example, the multiplication process may be accomplished by aligning the program number with a slave delay stage in such a way that the number is effectively shifted left or right where the multiplicand is a power of two. As yet a further example, the multiplication process may be accomplished by increasing or decreasing the number of delay element enable signals that are asserted in the slave delay stage as opposed to the master portion of the circuit. Based on the disclosure provided herein, one of ordinary skill in the art will recognize a variety of multiplication processes and/or multiplier circuits that may be used in relation to one or more embodiments of the present invention for increasing/decreasing the time delay implemented by one delay stage as compared with another.

Turning to FIG. 1a, a memory system 100 is shown that utilizes a combination memory controller 110 and a delay lock loop circuit 120 in accordance with one or more embodiments of the present invention. It should be noted that delay lock loop circuit 120 may be implemented on the same semiconductor die as memory controller 110, or may be implemented on a different die. Further, it should be noted that delay lock loop circuit 120 may be integrated with memory controller 110 or may be implemented as separate modules of the same circuit design. As shown, memory controller 110 includes a number of signals that are generated to allow access to one or more memory modules. Generation of such signals may be accomplished in various ways as are known in the art. For example, the same strobe signal may be used for both read and write signals, or a strobe signal for the read and a strobe signal for the write may be created internal to memory controller 110 and only at the interface of memory controller 110 are the two signals combined to drive the strobe I/O of the external memory. Delay lock loop circuit 120 includes a master portion consisting of one or more delay stages 142, 144, 146, 148, 150; and a feedback loop consisting of a phase comparator circuit 152 and a delay control circuit. Delay lock loop circuit 120 also includes a slave portion consisting of one or more slave delay stages 162, 164.

As shown, memory system 100 includes a bank 130 of double data rate memory blocks 134, 138. It should be noted that other memory types may be used in accordance with different embodiments of the present invention. Each of memory blocks 134, 138 includes an interface consisting of an address bus, a data bus, a strobe and a read/write control line. In operation, when data is to be written to memory block 134, the appropriate address is applied to the address bus, the read/write control line is asserted to indicate a write operation, data is placed on the data bus, and the strobe signal for memory block 134 (i.e., strobe 0) is asserted. The same process is done to write data to memory block 138, except that the strobe signal for memory block 138 (i.e., strobe 1) is asserted. In contrast, when data is to be read from memory block 134, the appropriate address is applied to the address bus, the read/write control line is asserted to indicate a read operation. Memory block 134 then asserts the strobe associated memory block 134 (i.e., strobe 0) coincident with applying data to the data bus. The same process is used for reading data from memory block 138, except that the strobe associated with memory block 138 is asserted. Both a 1× reference clock 123 (i.e., a clock that is capable of operating at approximately the frequency as either strobe 0 or strobe 1) and a 2× reference clock 122 (i.e., a clock that is capable of operating at least two times as fast as either strobe 0 or strobe 1) is associated with memory blocks 134, 138. Based on the disclosure provided herein, one of ordinary skill in the art will recognize a variety of interfaces or signal sets that may be used in accordance with different embodiments of the present invention.

In some cases, the strobe and the data are not properly aligned during the read and write cycles. In such cases, delay lock loop circuit 120 may be used to delay one or more strobe signals to create the appropriate alignment. As shown, a slave delay stage 162 is used to delay the strobe associated with memory block 134, and a slave delay stage 164 is used to delay the strobe associated with memory block 138. It should be noted that depending upon the configuration, slave delay stage 162 may be designed to delay a strobe received from memory block 134 by a particular amount, or slave delay stage 162 may be designed to delay a strobe provided to memory block 134 from memory controller 110. Similarly, depending upon the configuration, slave delay stage 164 may be designed to delay a strobe received from memory block 138 by a particular amount, or slave delay stage 164 may be designed to delay a strobe provided to memory block 138 from memory controller 110. The amount of delay applied by slave delay stage 162 and slave delay stage 164 is controlled by delay lock loop circuit 120. It should be noted that delay lock loop circuit 120 may be implemented in relation to a circuit other than a memory controller. Based on the disclosure provided herein, one of ordinary skill in the art will recognize a variety of applications that may benefit from use of such a delay lock loop circuit.

The aforementioned process of delaying strobes using slave delay stages 162, 164 is graphically displayed in FIG. 1*b*. Turning to FIG. 1*b*, a timing diagram 190 shows data 192 applied to the aforementioned data bus and a corresponding strobe in 194. As shown, strobe in 194 transitions coincident with the change in data 192. In some cases such an immediate transition results in a setup or hold problem in either memory blocks 134, 138 or a device receiving data from memory blocks 134, 138. By introducing a controlled time delay 198 to strobe in 194, any setup or hold problems may be averted. As more fully discussed below, time delay 198 is programmable by selecting a different number of delay elements implemented as part of slave delay stages 162, 164.

The number of delay elements utilized in slave delay stages 162, 164 is determined through delay locking to 2× reference clock 122 using delay lock loop circuit 120. Delay lock loop circuit 120 includes delay stage 142, delay stage 144, delay stage 146, delay stage 148 and delay stage 150. In some instances, all of delay stages 142, 144, 146, 148, 150 are substantially identical including the same number of delay elements. As shown, 2× reference clock 122 and 1× reference clock 123 are applied as inputs to a multiplexer 127. Depending upon the assertion level of a select signal 121, one of 2× reference clock 122 or 1× reference clock 123 is applied as an input to delay stage 142. The output of delay stage 142 is the input of delay stage 144, the output of delay stage 144 is the input of delay stage 146, the output of delay stage 146 is the input of delay stage 148, and the output of delay stage 148 is the input of delay stage 150.

By providing an ability to select between 2× reference clock 122 and 1× reference clock 123 using multiplexer 127, a wide operational range with a desired resolution may be achieved. In particular, when high frequency operation is desired, 1× reference clock 123 is selected. When low frequency operation is desired, 2× reference clock 122 is selected. When high frequency operation is selected using select signal 121, a multiplier circuit 102 is bypassed. In contrast, when low frequency operation is selected using select signal 121, multiplier circuit 102 is used to modify the number of delay elements utilized by slave delay stages 162, 164. The use of multiplier circuit 102 decreases the resolution offered, but this is not as important during low frequency operation. Allowing for both high frequency and low frequency operation reduces the number of delay elements required to meet a three-hundred, sixty degree locking capability.

The output of delay stage 150 (or in some cases, an output of one of the other delay stages 142, 144, 146, 148) is compared with the output of multiplexer 127 by a phase comparator 152. The output of phase comparator 152 indicates whether the number of delay elements currently utilized in each of delay stages 142, 144, 146, 148, 150 is to be incremented, decremented or left constant in order to achieve the desired delay lock. In particular, phase comparator 152 provides an increment/decrement signal 153 to a delay control circuit 154. Based on increment/decrement signal 153, delay control circuit 154 controls the number of delay elements used by each of delay stages 142, 144, 146, 148, 150. The number of delay elements used by each of delay stages 142, 144, 146, 148, 150 is multiplied by a multiplier circuit 102. The product of multiplier circuit 102 is used to select the number of delay elements utilized in each of delay stages 162, 164.

As an example, the delay elements utilized in each of delay stages 142, 144, 146, 148, 150 each provide approximately the same incremental delay (i.e., resolution) as the delay elements used in slave delay stages 162, 164. Thus, where delay lock loop 120 is synchronized to a clock (i.e., 2× Reference Clock 122) that operates at approximately twice the frequency of the signals (i.e., strobe 0 and strobe 1) delayed by slave delay stages 162, 164, then the number of delay elements used by each of delay stages 142, 144, 146, 148, 150 may be approximately half the number of delay elements used by slave delay stages 162, 164 to produce a corresponding delay. In this case, multiplier circuit 102 may be set to apply a two times (i.e., the multiplicand is two) multiplication. In such a case, multiplier circuit 102 may be implemented as any multiplier circuit known in the art that is capable of multiplying an input by two and providing a product of the multiplication to select the number of delay elements used in slave delay stages 162, 164. In one particular case, multiplier circuit 102 may be a shift register that is operable to shift the number of delay elements used by delay stages 142, 144, 146, 148, 150 left by one bit position. As another particular case, multiplier circuit 102 may be a register that is aligned with the number of delay elements used by delay stages 142, 144, 146, 148, 150 such that the number is shifted to the left by one bit position. Based on the disclosure provided herein, one of ordinary skill in the art will recognize a number of multiplier circuits 102 that may be used in relation to one or more embodiments of the present invention. As one advantage, by locking delay lock loop circuit 120 to a 2× frequency signal, delay stages 142, 144, 146, 148, 150 may be implemented with half of the delay elements as would otherwise be needed to produce a delay number to be used by slave delay stages 162, 164.

As another example where the delay elements utilized in each of delay stages 142, 144, 146, 148, 150 each provide approximately the same incremental delay as the delay elements used in slave delay stages 162, 164, delay lock loop 120 may be synchronized to a clock that operates at approximately four times the frequency of the signals delayed by slave delay stages 162, 164. In such a case, the number of delay elements used by each of delay stages 142, 144, 146, 148, 150 may be approximately one quarter the number of delay elements used by slave delay stages 162, 164 to produce a corresponding delay. In this case, multiplier circuit 102 may be set to apply a four times (i.e., a multiplicand of four) multiplication. In such a case, multiplier circuit 102 may be implemented as any multiplier circuit known in the art that is capable of multiplying an input by four and providing a product of the multiplication to select the number of delay elements used in slave delay stages 162, 164. In one particular case, multiplier circuit 102 may be a shift register that is operable to shift the number of delay elements used by delay stages 142, 144, 146, 148, 150 left by two bit positions. As another particular case, multiplier circuit may be a register that is aligned with the number of delay elements used by delay stages 142, 144, 146, 148, 150 such that the number is shifted to the left by two bit positions. Again, based on the disclosure provided herein, one of ordinary skill in the art will recognize a number of multiplier circuits 102 that may be used in relation to one or more embodiments of the present invention. As one advantage, by locking delay lock loop circuit 120 to a 4× frequency signal delay stages 142, 144, 146, 148, 150 may be implemented with one quarter of the delay elements as would otherwise be needed to produce a delay number to be used by slave delay stages 162, 164.

While examples of multiplying the number of delay elements utilized by delay stages 142, 144, 146, 148, 150 by two and by four, it should be noted that based on the disclosure provided herein, one of ordinary skill in the art will recognize a number of different multiplicands that may be used in accordance with different embodiments of the present invention. Such multiplicands may be, but are not required to be, powers of two ($2^n$). Such powers of two may include, but are not limited to, ¼, ½, 2, 4 and 8. Any of such powers of two may be achieved by shifting an input value to the right or left. Again, it should be noted that the multiplicand may be any value where multiplier circuit 102 is designed as a traditional multiplier circuit rather than a simple shift register.

Turning to FIGS. 2a-2e, a delay lock loop circuit 200 locking to a 2× reference signal 201 in accordance with some embodiments of the present invention is shown. Delay lock loop circuit 200 may be used in place of the master portion of delay lock loop circuit 120 where the 2× reference clock has been selected using multiplexer 127. It should be noted that delay lock loop circuit 200 includes circuitry for reducing glitches that may or may not be included in relation to different embodiments of the present invention. Delay lock loop circuit 200 includes a set of delay stages 242, 244, 246, 248, 250. Further, delay lock loop circuit 200 includes a feedback loop that includes a phase comparator 210, an enable generator 220, and a unified selector register 230. Delay lock loop circuit 200 also includes a reference signal gate 202, and a phase selector multiplexer 252. In one particular embodiment of the present invention, each of the aforementioned delay stages is designed to implement a phase delay of about seventy-two degrees. In such cases, phase selector multiplexer 252 provides an ability to select between a one stage seventy-two degree phase shift or a one stage ninety degree phase shift depending upon whether a selector input 253 is set such that phase selector multiplexer 252 causes stage output 249 or stage output 251 to drive a multiplexer output 254. Based on the disclosure provided herein, one of ordinary skill in the art will recognize a variety of embodiments that do not employ a multiplexer 252, or that employ additional multiplexers to allow for selection of different stage outputs.

Reference signal gate 202 receives 2× reference signal 201 and provides a gated reference signal 203. One particular embodiment of the present invention includes an AND gate that ANDs an inverted version of gate control output 222 with 2× reference signal 201. In some cases, circuitry is included that controls the timing of gate control output such that producing gated reference signal 203 from 2× reference signal 201 does not result in glitches on gated reference signal 203. Delay stage 242 receives gated reference signal 203, and provides a stage output 243. Stage output 243 is gated reference signal 203 delayed by a determined amount. Delay stage 244 receives stage output 243, and provides a stage output 245. Stage output 245 is stage output 243 delayed by a determined amount. Delay stage 246 receives stage output 245, and provides a stage output 247. Stage output 247 is stage output 245 delayed by a determined amount. Delay stage 248 receives stage output 247, and provides a stage output 249. Stage output 249 is stage output 247 delayed by a determined amount. Delay stage 250 receives stage output 249, and provides a stage output 251. Stage output 251 is stage output 249 delayed by a determined amount. Each of delay stages 242, 244, 246, 248, 250 includes a number of delay elements that may be selectably incorporated in a delay chain.

Gated reference signal 203, stage output 245, and one of stage output 249 or stage output 251 are provided to an up/down generator 216 of phase comparator 210. Up/down generator 216 provides an output to an increment generator 214 that indicates whether a number of delay elements used in each of delay stages 242, 244, 246, 248, 250 should be incremented, decremented or maintained constant to achieve the desired phase shift. Increment generator 214 provides an output to a lock generator 212 that provides a lock output 213.

In addition, increment generator 214 provides an increment/decrement signal 215 to an enable generator 220. Enable generator 220 controls the modification of a unified selector register 230 via a set of control signals 221. In one particular embodiment of the present invention, control signals 221 include an enable signal and an increment/decrement signal. In such a case when the increment/decrement signal indicates an increment and the enable signal is asserted, the value maintained in unified selector register 230 is incremented. Alternatively, when the increment/decrement signal indicates a decrement and the enable signal is asserted, the value maintained in unified selector register 230 is decremented. In such an embodiment, a lock condition may be indicated (i.e., lock output 213 is asserted) when the value in selector register is to be maintained constant. In such cases, the enable signal is not asserted when the lock condition is indicated.

In some embodiments of the present invention, enable generator 220 includes a counter circuit that is synchronized to 2× reference signal 201. The counter circuit periodically asserts an enable signal (part of control signals 221). In one particular embodiment of the present invention, the counter circuit asserts the enable signal once for every four cycles of 2× reference signal 201 when the lock condition has not been established. In such a case, a gate control output 222 derived from the counter may be provided to reference signal gate 202 such that gated reference signal 203 does not assert when the enable of control signals 221 is asserted. In this way, glitches are avoided when the value in unified selector register 230 is updated.

An X-bit selector value 232 maintained in unified selector register 230 is provided to each of delay stages 242, 244, 246, 248, 250. In operation, X-bit selector value 232 selects the number of the delay elements in each of delay stages 242, 244, 246, 248, 250 that are used in a delay chain implemented by the respective delay stage. In one particular embodiment of the present invention, X-bit selector register is sixty-three bits wide, and the number of selectable delay elements in each of delay stages 242, 244, 246, 248, 250 is also sixty-three. It should be noted that the aforementioned delay width and register width is related to a particular implementation. It should also be noted that in contrast to the preceding example, the width of unified selector register 230 need not necessarily match the number of delay elements implemented in each of delay stages 242, 244, 246, 248, 250. Further, it should be noted that each of delay stages 242, 244, 246, 248, 250 do not necessarily need to include the same number of delay elements. Based on the disclosure provided herein, one of ordinary skill in the art will recognize a number of different delay widths and register widths that may be used in accordance with different embodiments of the present invention.

X-bit value 232 multiplied by a multiplicand using a multiplier circuit 285 may be used to select a number of delay elements of one or more slave delay stages (not shown). In such cases, X-bit value 232 may be stored in a register 290. An output 293 of register 290 is combined with a fixed least significant bit 283 from an LSB circuit 280. Combining output 293 with fixed least significant bit 283 in this way causes results in a program number output 292 that is the X-bit value 232 multiplied by two. Again, it should be noted that multiplier circuit 285 may be any multiplier circuit known in the art, and may be designed to multiply X-bit value 232 by any number depending upon the particular design in which it is implemented.

Operation of delay lock loop circuit 200 is described in relation to a timing diagram 295 of FIG. 2b. Turning to FIG. 2b, 2× reference signal 201 is shown as a repeating clock with approximately a fifty percent duty cycle. As shown, enable generator 220 asserts gate control output 222 once every four cycles of 2× reference signal 201. Reference signal gate 202 gates 2× reference signal 201 with gate control output 222 to produce gated reference signal 203. In this example, gate control output 222 and the enable that is part of signals 221 have the same characteristics. In particular, gated reference signal 203 is 2× reference signal 201 that is not asserted whenever gate control output 222 is asserted.

Whenever the value in unified selector register 230 is to be incremented, increment generator 214 asserts increment/decrement signal 215 to indicate an increment operation (e.g., a logic '1' in this example). Alternatively, whenever the value in unified selector register 230 is to be decremented, increment generator 214 asserts increment/decrement signal 215 to indicate a decrement operation (e.g., a logic '0' in this example). Increment/decrement signal 215 is re-clocked by enable generator 220 as increment signal (part of signals 221). Signals 221 are passed by enable generator 220 to unified selector register 230 where they cause either an increment or decrement of X-bit value 232 upon the next positive edge of 2× reference signal 201. As previously stated, X-bit value 232 causes a change in the number of delay elements utilized in delay stages 242, 244, 246, 248, 250 (i.e., a change in the delay incurred through each of the respective delay stages).

Figure 2A:
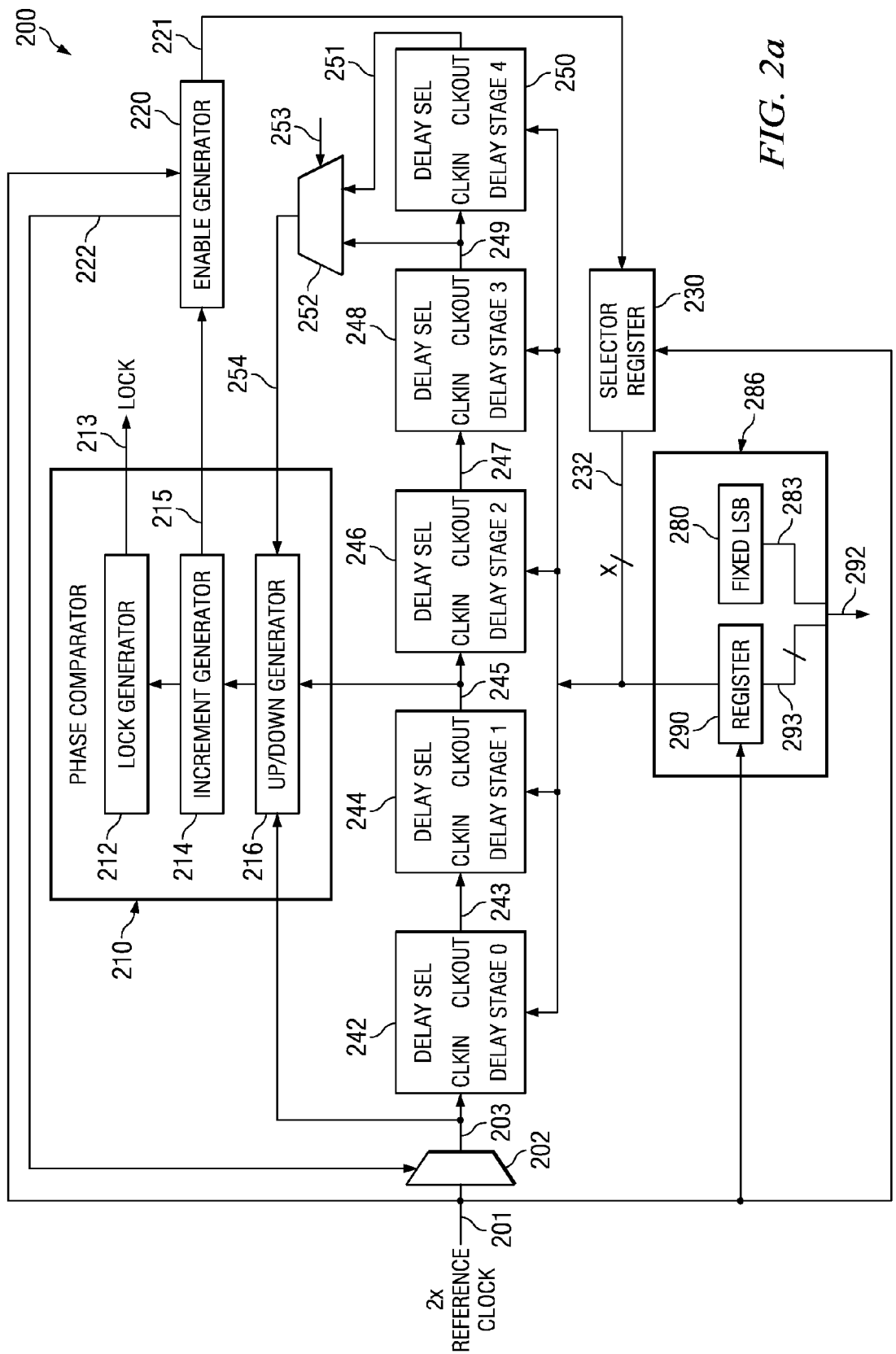
Figure 2C:
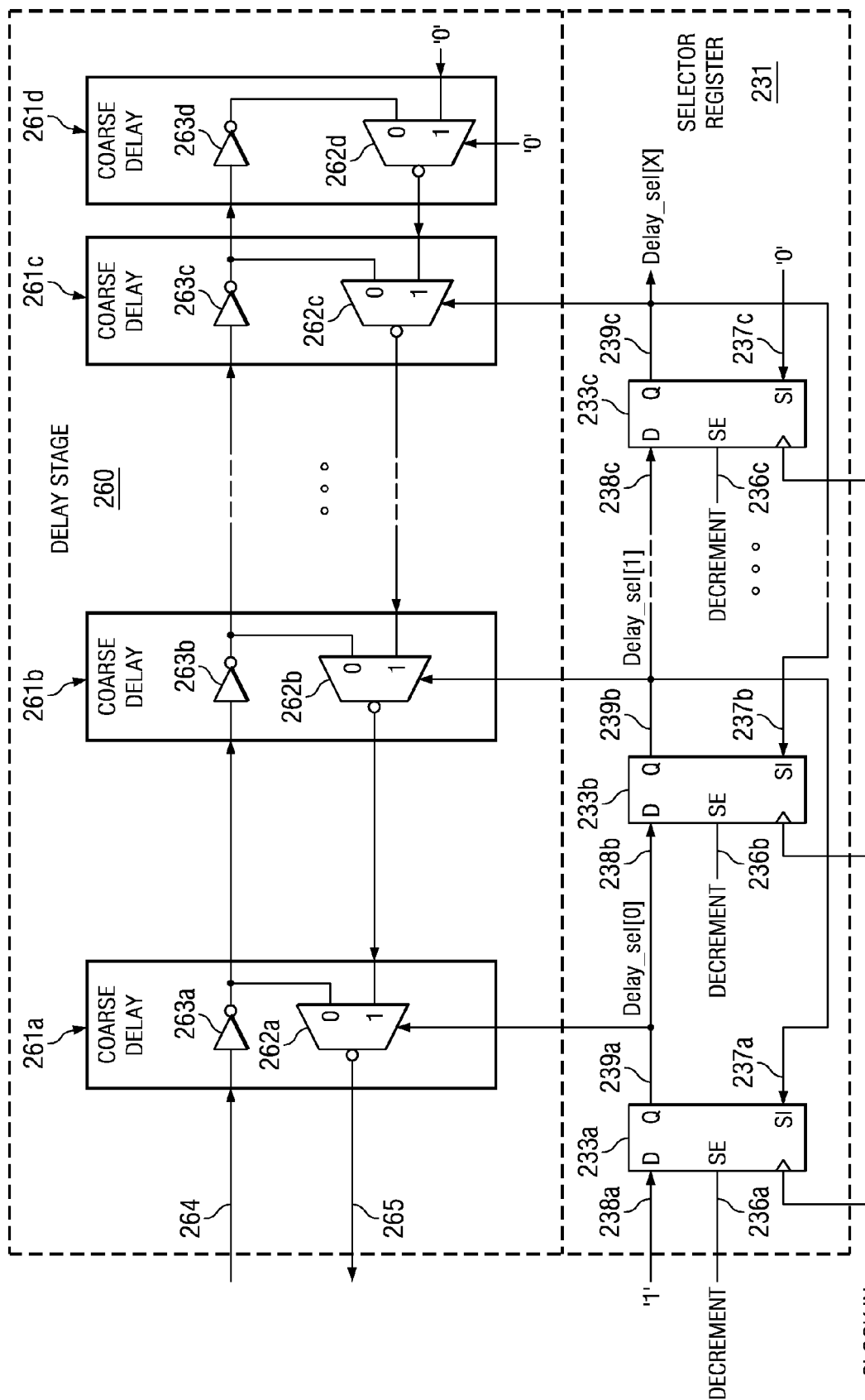

Turning to FIG. 2c, a detailed schematic of one implementation of a delay stage 260 and a selector register 231 is shown. Delay stage 260 may be used in place of any or all of delay stages 242, 244, 246, 248, 250 discussed above in relation to FIG. 2a or delay stages 142, 144, 146, 148, 150 discussed above in relation to FIG. 1a. Similarly, selector register 231 may be used in place of selector register 232 discussed above in relation to FIG. 2a. As shown, delay stage 260 includes a number of delay elements 261 that can be configured as a chain of delay elements including one delay element up to the total number of delay elements depending upon the value maintained in selector register 231. Delay stage 260 receives an input signal 264 and provides an output signal 265. As an example, where delay stage 260 is used in place of delay stage 242, input signal 264 corresponds to gated reference signal 203 and output signal 265 corresponds to stage output 243. Similarly, inputs from selector register 231 correspond to X-bit value 232.

Each delay element 261 includes a delay buffer 263 that may be, but is not limited to an inverting buffer, a logic gate, or a non-inverting buffer. Based on the disclosure provided herein, one of ordinary skill in the art will recognize a variety of circuits that may be used to cause a signal delay. In addition, each delay element 261 includes a multiplexer 262 that is controlled by an input from selector register 231 and is used to control whether the particular delay element is included in an overall delay chain implemented by delay stage 260. In particular, when the value provided from selector register 231 is a logic '1', the particular delay element is not selected. In contrast, when the value provided from selector register 231 is a logic '0', the particular delay element is selected. As each delay element 261 drives a subsequent delay element 261 (i.e., the output of delay element 261d, drives the output of delay element 261c), the value provided from selector register 231 includes a series of logic '1's followed by a series of logic '0's, with the transition between logic '0's and logic '1's being positioned such that it corresponds to the overall delay line length implemented in delay stage 260.

Selector register 231 is implemented as a shift register that causes a series of logic '1's followed by a series of logic '0's to shift right whenever the delay implemented by delay stage 261 is to be increased, and to shift left whenever the delay implemented by delay stage 261 is to be decreased. In particular, selector register 231 includes a number of flip-flops 233 configured in series. Each of flip-flops 233 includes a shift enable input 236, a scan input 237, a data input 238 and an output 239. In operation, when a shift right is to occur, an increment signal input (e.g., part of signals 221) is asserted high, and upon the next assertion of a clock input (e.g., 2× reference signal 201) the block of logic '1's followed by the block of logic '0's shifts right. In contrast, when a shift left is to occur, the increment signal input (e.g., part of signals 221) is asserted low, and upon the next assertion of a clock input (e.g., 2× reference signal 201) the block of logic '1's followed by the block of logic '0's shifts left. In some cases, an additional enable signal may be added to each of flip-flops 233 that enables both right and left shifting. Based on the disclosure provided herein, one of ordinary skill in the art will recognize other designs for implementing selector register 231. The outputs of flip-flops 233 are collectively referred to as delay element enable signals.

It should be noted that where X-bit value 232 is derived from selector register 231, multiplier circuit 285 may be designed such that it doubles (i.e., replicates each bit one time) each of the logic '1's and logic '0's of X-bit value 232 to achieve the desired multiplication by two. Alternative, X-bit value 232 may be encoded to provide a binary representation of the number of logic '1's that are included, and the binary value may be left shifted or otherwise multiplied as discussed above. Again, based on the disclosure provided herein, one of ordinary skill in the art will recognize a variety of multiplier circuits that may be used in relation to different embodiments of the present invention.

Turning to FIG. 2d, an exemplary up/down and increment generator circuit 270 that may be used in relation to one or more embodiments of the present invention is depicted. Up/down and increment generator circuit 270 may be used in place of up/down generator 216 and increment generator 214 discussed above in relation to FIG. 2a. Up/down and increment generator circuit 270 includes a number of flip-flops 271 that are each clocked using different outputs and inputs from delay stages 242, 244, 246, 248, 250. In particular, a flip-flop 271a is clocked by stage output 245, a flip-flop 271b is clocked by multiplexer output 254 that is either stage output 249 or stage output 251, and a flip-flop 271c is clocked by gated reference signal 203. A flip-flop 271d is clocked by the output of flip-flop 271c. The data input of both flip-flop 271b and flip-flop 271c are connected to the output of flip-flop 271a. The output of flip-flop 271b (i.e., a down signal 273) and the output of flip-flop 271c (i.e., an up signal 274) are applied as inputs to a NAND gate 272, and the output of NAND gate 272 is applied to the input of flip-flop 271a. The output of flip-flop 271b is also applied to the input of flip-flop 271d. The output of flip-flop 271d is increment/decrement signal 215.

Operation of up/down and increment generator circuit 270 is described in relation to a timing diagram 297 of FIG. 2b. As shown, gated reference signal 203 is a gated version of a cock signal with two out of every four clock cycles gated out by reference signal gate 202. Gated reference signal 203 is passed through delay stage 242 and delay stage 244 to create stage output 245. Multiplexer output 254 is gated reference signal 203 after it has been passed through delay stage 242, delay stage 244, delay stage 246, delay stage 248 and in some cases delay stage 250 depending upon the assertion of selector input as discussed above in relation to FIG. 2a. As shown, up signal 274 and down signal 273 are originally asserted at a logic '0'. Upon the next positive transition of stage output 245, the output of flip-flop 271a transitions to a logic '1'. Then, upon the next positive transition of gated reference clock 203, up signal 274 transitions to a logic '1', and upon the next positive transition of multiplexer output 254, down signal 273 transitions to a logic '1'. Where up signal 274 transitions before down signal 273, increment/decrement signal 215 is asserted as a logic '0'. In contrast, where up signal 274 transitions after down signal 273, increment/decrement signal 215 is asserted as a logic '1'. In this way, a signal indicating whether the value in unified selector register 230 may be incremented or decremented based on a comparison of a phase shifted version of a reference clock with the reference clock. It should be noted that up/down and increment generator circuit 270 is merely exemplary, and that one of ordinary skill in the art will recognize other up/down circuits that may be used in relation to various embodiments of the present invention.

Figure 3:
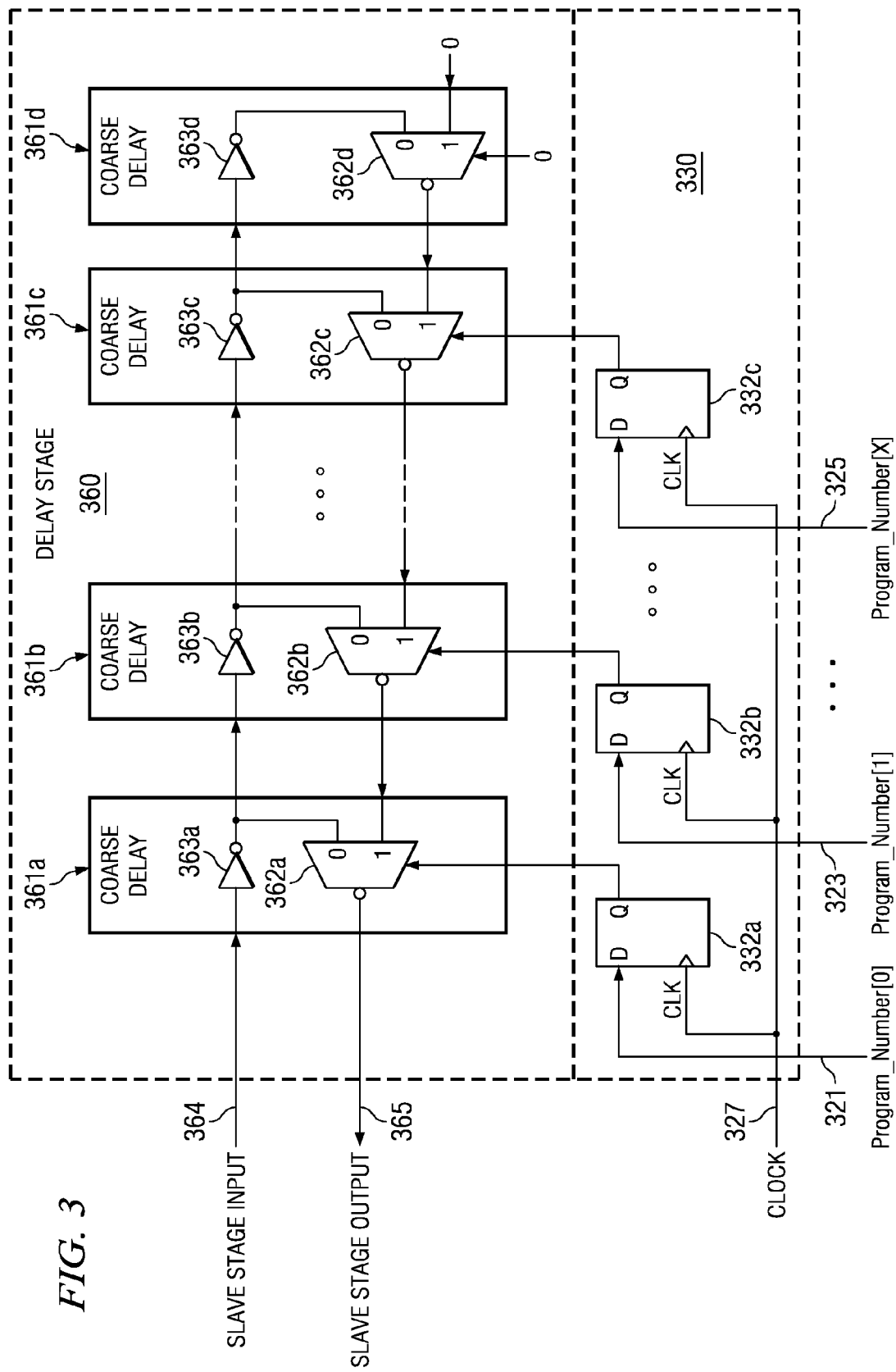
FIG. 3 depicts a slave delay stage along with an interface circuit that may be implemented in relation to various embodiments of the present invention.

Turning to FIG. 3, a slave delay stage 360 along with an interface register 330 is shown in accordance with various embodiments of the present invention. Slave delay stage 360 may be used in place of any or all of slave delay stages 162, 164 discussed above in relation to FIG. 1a. Interface register 330 is used to register program number output 292 discussed above in relation to FIG. 2a. Interface register 330 is a group of D type flip-flops 332 that registers program number output 292 whenever a clock 327 is asserted. In particular, the least significant bit of program number output 292 corresponds to program_number[0] 321, the next bit of program number output 292 corresponds to program_number[1] 323, and the most significant bit of program number output 292 corresponds to program_number[X] 325. The outputs of flip-flops 332 are collectively referred to as delay element enable signals. As shown, slave delay stage 360 includes a number of delay elements 361 that can be configured as a chain of delay elements including one delay element up to the total number of delay elements depending upon the value maintained in interface register 330. Slave delay stage 360 receives an input signal 364 and provides an output signal 365. As an example, where delay stage 360 is used in place of slave delay stage 162, input signal 364 corresponds to strobe 0x and output signal 365 corresponds to strobe 0.

Each delay element 361 includes a delay buffer 363 that may be, but is not limited to, an inverting buffer, a logic gate, or a non-inverting buffer. Based on the disclosure provided herein, one of ordinary skill in the art will recognize a variety of circuits that may be used to cause a signal delay. In addition, each delay element 361 includes a multiplexer 362 that is controlled by an input from interface register 330 and is used to control whether the particular delay element is included in an overall delay chain implemented by delay stage 360. In particular, when the value provided from interface register 330 is a logic '1', the particular delay element is not selected. In contrast, when the value provided from selector register 330 is a logic '0', the particular delay element is selected. As each delay element 361 drives a subsequent delay element 361 (e.g., the output of delay element 361d, drives the output of delay element 361c), the value provided from selector register 330 includes a series of logic '1's followed by a series of logic '0's, with the transition between logic '0's and logic '1's being positioned such that it corresponds to the overall delay line length implemented in delay stage 360.

Again, it should be noted that X-bit output 232 may be encoded. In such cases, an decoder may be implemented to decode program number output 292 before it is registered by interface register 330. In any event, interface circuitry capable of translating program number output 292 into the number of delay elements 361 to be utilized in slave delay stage 361 may be implemented in accordance with different embodiments of the present invention. Further, it should be noted that a different delay element configuration and associated interface register may be utilized as will be appreciated by one of ordinary skill in the art based on the disclosure provided herein.

Figure 4:
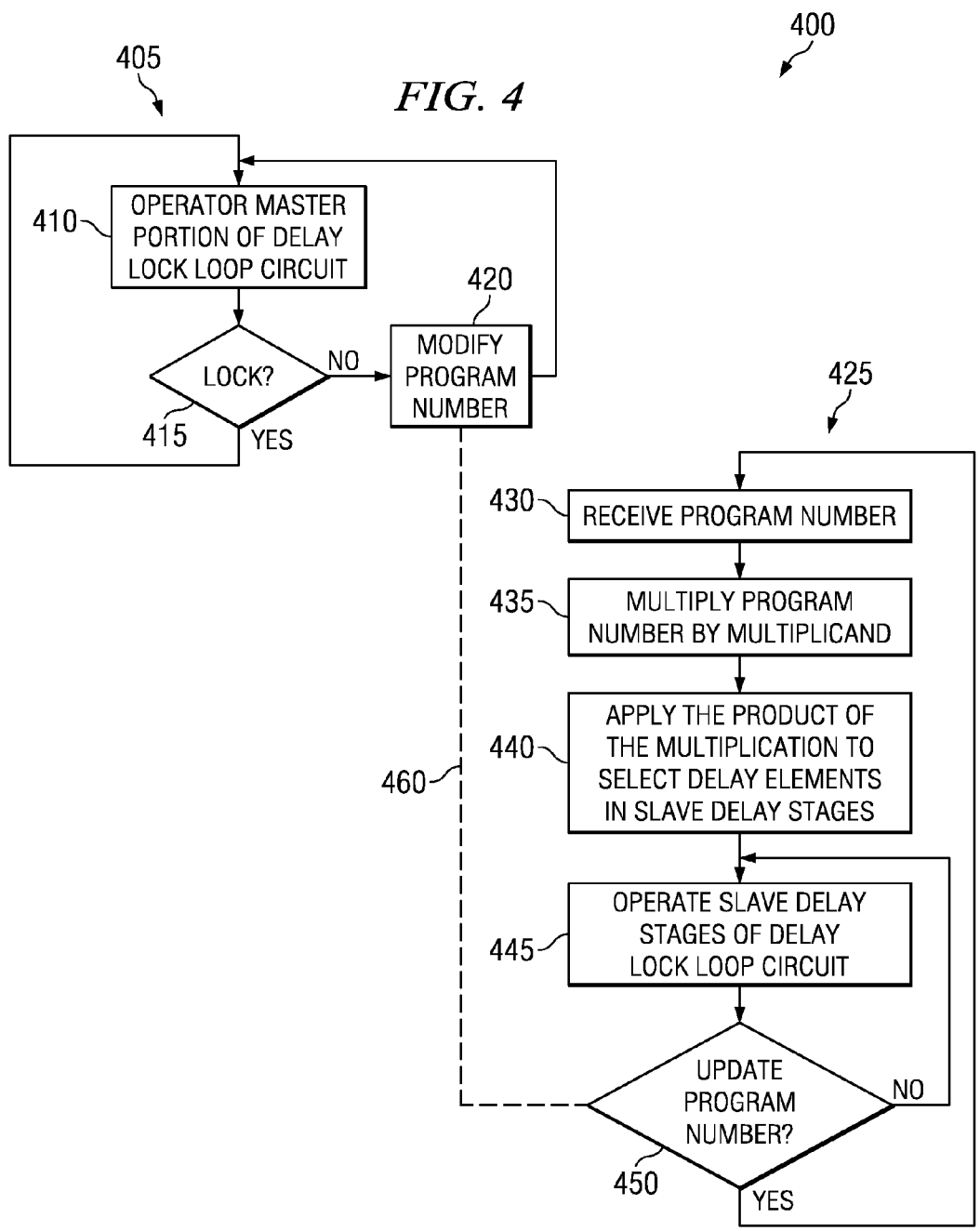
FIG. 4 is a flow diagram showing a method in accordance with embodiments of the present invention for signal synchronization.

Turning to FIG. 4, a flow diagram 400 depicts a method for signal synchronization in accordance with one or more embodiments of the present invention. Flow diagram 400 includes a master flow 405 and a slave flow 425. In some cases, master flow 405 and slave flow 425 operate simultaneously with little or no interaction. In other cases, as suggested by a dashed line 460, portions of slave flow 425 are only operated when certain conditions of master flow 405 are identified. In yet other cases where circuitry used for the master portion is reused in the slave portion, master flow 405 and slave flow 425 do not operate at the same time.

Following master flow 405, a master portion of a delay lock loop circuit is operated (block 410). Operation of the delay lock loop circuit includes comparing a reference signal with a delayed derivative of the reference signal. The delayed derivative of the reference signal is created by applying the reference signal to one or more delay stages that each include a programmable number of delay elements. Where the delayed derivative of the reference signal is in phase with the reference signal, the two signals are considered locked (block 415). Where the two signals are not locked (block 415), the programmable number of delay elements utilized in the one or more delay stages is modified either up or down in an effort to achieve the lock condition (block 420). Thus, the master portion of the delay lock loop circuit operates to establish a program number that represents the number of delay elements that are used in the one or more delay stages to phase align the delayed derivative of the reference signal with the reference signal.

The program number established in master flow 405 is received by slave flow 42 (block 430). The program number is multiplied by a determined multiplicand (block 435), and the product of the multiplication is provided to one or more slave delay stages to select the number of delay elements included in the slave delay stages that are utilized (block 440). The slave delay stages are then operated to delay input signals by an amount corresponding to the product of the multiplication (block 445). It is then determined whether the program number has been updated (block 450). Where the program number has not been changed (block 450), operation of the slave delay stages continues without change (block 445). Alternatively, where the program number has been modified (block 450), the processes of blocks 430-445 are repeated. Again, it should be noted that the multiplication process increases resolution error, but this is less important for operation at lower frequencies. Where higher frequency operation is called for, the multiplication process is not performed.

In conclusion, the present invention provides novel systems, devices, methods for signal synchronization. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A method for reduced area delay signal timing, the method comprising:
providing a delay lock loop circuit, wherein the delay lock loop circuit includes a plurality of selectable delay elements;
operating the delay lock loop circuit in a first mode, wherein a program number is established in relation to a reference frequency, and wherein the program number corresponds to a number of the plurality of selectable delay elements used to establish a first delay time at the reference frequency;
multiplying the program number by a multiplicand; and
operating the delay lock loop circuit in a second mode, wherein an input signal is applied to the delay lock loop circuit, wherein a derivative of the input signal is provided as an output that is delayed by a second delay time corresponding to the multiplied program number, and wherein the second delay time is approximately the first delay time multiplied by the multiplicand.

2. The method of claim 1, wherein the multiplicand is $2^n$, and wherein n is a non-zero integer.

3. The method of claim 2, wherein multiplying the program number by the multiplicand is accomplished by a process selected from a group consisting of: applying the multiplicand and the program number to a multiplier circuit, left shifting the program number, right shifting the program number, left aligning the program number, right aligning the program number, and replicating delay element enable signals.

4. The method of claim 3, wherein the multiplicand is the integer two, and wherein multiplying the program number by the multiplicand includes aligning the program number to the left by one bit.

5. The method of claim 3, wherein the multiplicand is the integer two, and wherein multiplying the program number by the multiplicand includes replicating each delay element enable signal.

6. The method of claim 1, wherein the first mode is a master mode, wherein the second mode is a slave mode, and wherein the master mode and the slave mode operate at the same time.

7. The method of claim 1, wherein the delay lock loop circuit is implemented in relation to a DDR memory, and wherein the reference frequency is obtained by using a 2× clock implemented as part of the DDR memory interface.

8. The method of claim 1, wherein the delay lock loop circuit is operable to provide a particular delay using a reduced area when compared with a non-multiplying delay lock loop circuit.

9. The method of claim 1, wherein the plurality of selectable delay elements is a first plurality of selectable delay elements incorporated in a first delay stage, wherein the delay lock loop circuit includes a second plurality of selectable delay elements incorporated in a second delay stage, wherein in the master mode a reference clock operating at the reference frequency is applied to the first delay stage and an output of the first delay stage is applied to the second delay stage.

10. The method of claim 9, wherein the input signal is a first input signal, and wherein operating the delay lock loop circuit in the second mode includes:
applying the first input signal to the first delay stage programmed with the program number multiplied by the multiplicand, wherein the first delay stage provides a first delay output; and
applying a second input signal to the second delay stage programmed with the program number multiplied by the multiplicand, wherein the second delay stage provides a second delay output.

* * * * *